US007803885B2

(12) United States Patent
Brennan et al.

(10) Patent No.: US 7,803,885 B2
(45) Date of Patent: Sep. 28, 2010

(54) PENTATHIENYL-FLUORENE COPOLYMER

(75) Inventors: David J. Brennan, Midland, MI (US); Dean M. Welsh, Midland, MI (US); Yu Chen, Midland, MI (US); Jeff M. Shaw, Saginaw, MI (US)

(73) Assignee: Dow Global Technologies Inc., Midland, MI (US)

( * ) Notice: Subject to any disclaimer, the term of this patent is extended or adjusted under 35 U.S.C. 154(b) by 800 days.

(21) Appl. No.: 10/592,872

(22) PCT Filed: Mar. 1, 2005

(86) PCT No.: PCT/US2005/006735

§ 371 (c)(1),
(2), (4) Date: Feb. 21, 2007

(87) PCT Pub. No.: WO2005/092947

PCT Pub. Date: Oct. 6, 2005

(65) Prior Publication Data

US 2007/0210302 A1 Sep. 13, 2007

Related U.S. Application Data

(60) Provisional application No. 60/554,218, filed on Mar. 17, 2004.

(51) Int. Cl.
*C08G 75/06* (2006.01)
*H01L 51/00* (2006.01)

(52) U.S. Cl. ............... 525/535; 528/380; 528/377; 528/378; 257/40

(58) Field of Classification Search ............ 528/380, 528/377, 378; 525/535; 257/40
See application file for complete search history.

(56) References Cited

U.S. PATENT DOCUMENTS 5,777,070 A 7/1998 Inbasekaran et al.

6,169,163 B1 1/2001 Woo et al.

FOREIGN PATENT DOCUMENTS

EP 1 475 401 A 11/2004

OTHER PUBLICATIONS

M. Dibbs et al., "Fluorene Arylene Copolymers for Organic Photovoltaic Devices", Proceedings of Spie-the International Society for Optical Engineering, vol. 5520, (2004), pp. 90-97.
X. Zhou et al., "Theoretical investigation on the ground- and excited-state properties of novel octupolar oligothiophene-functionalized truxenes and dipolar analogs", Polymer, 45, (2004), pp. 7747-7757.
J. Kromer et al., "Homologous series of regioregular alkylsubstituted oligothiophenes up to an 11-mer", Tetrahedron 57, (2001), pp. 3785-3794.

(Continued)

*Primary Examiner*—Duc Truong
(74) *Attorney, Agent, or Firm*—Sughrue Mion, PLLC

(57) ABSTRACT

The present invention relates to a pentathienyl-fluorene copolymer having structural units represented by formula (I): here R and R' are each independently a substituent or H. The invention also relates to a transistor containing this copolymer. The present invention addresses a problem in the art by providing an electroactive device with exceptionally low hysteresis.

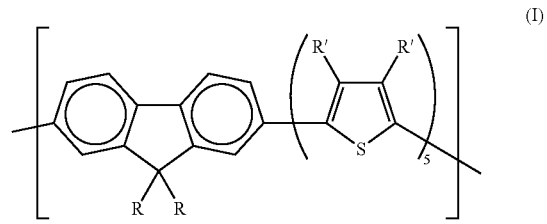

10 Claims, 1 Drawing Sheet

OTHER PUBLICATIONS

T.M. Barclay et al., "Oligothiophenes End-Capped by Nitriles. Preparation and Crystal Structures of α,ω-Dicyanooligothiophenes $NC(C_4H_2S)_nCN$ (c =3–6)", Chemistry of Materials, 9(4), (1997), pp. 981-990.

J.C. Horne et al., "Rotational Isomerization Barriers of Thiophene Oligomers in the Ground and First Excited Electronic States. A $^1H$ NMR and Fluorescence Lifetime Investigation", J. Am. Chem. Soc. 117, (1995), 9551-9558.

S. Danishefsky et al., "Selective Carbon-Carbon Bond Formation via Transition Metal Catalysis.3.[1] A Highly Selective Synthesis of Unsymmetrical Biaryls and Diarylmethanes by the Nickel- or Palladium- Catalyzed Reaction of Aryl- and Benzylzinc Derivatives with Arly Halides", J. Org. Chem., vol. 42, No. 10, (1977), pp. 1821-1823.

N. Miyaura et al., "Palladium-Catalyzed Cross-Coupling Reactions of Organoboron Compounds", Chem. Rev. 95, (1995), pp. 2457-2483.

Synthesis and Electroluminescent Properties of Copolymer of Fluorene and Thiophene, Acta Polymerica Sinica, No. 2, pp. 161-166.

PENTATHIENYL-FLUORENE COPOLYMER

CROSS-REFERENCE STATEMENT

This application claims the benefit of U.S. Provisional Application No. 60/554,218, filed Mar. 17, 2004.

GOVERNMENT CONTRACT

This invention was made with United States Government support under Cooperative Agreement No. 70NANB0H3033 awarded by NIST. The United States Government has certain rights in the invention.

BACKGROUND OF THE INVENTION

The present invention relates to a pentathienyl-fluorene copolymer. To function optimally, transistors need to be turned on and off within a narrow voltage range. The voltage required to actuate a transistor is referred to as the threshold voltage, the stability of which depends on the properties of the semiconducting material in the transistor. Many semiconducting materials that would otherwise operate in transistor applications, are inappropriate due to a high variability of the threshold voltage that results from the use of these materials. Consequently, the search for semiconductors with low threshold voltage variability is an ongoing challenge in the field of semiconductors for transistor applications.

SUMMARY OF THE INVENTION

The present invention addresses a problem in the art by providing in a first aspect a pentathienyl-fluorene copolymer having structural units represented by following formula:

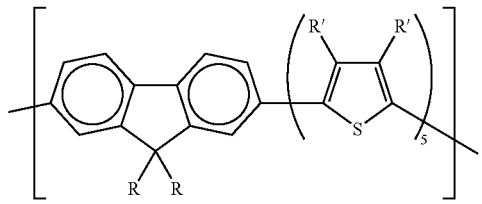

where R and R' are each independently a substituent or H.

In a second aspect, the present invention is a transistor comprising a semiconducting transistor channel constructed of a pentathienyl-fluorene copolymer having structural units represented by following formula:

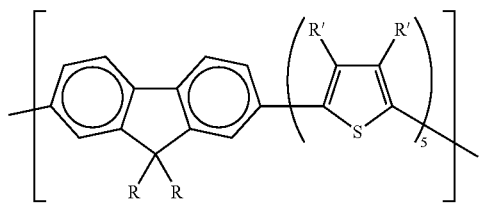

where R and R' are each independently a substituent or H. The present invention addresses a problem in the art by providing an electroactive device with exceptionally low hysteresis.

DETAILED DESCRIPTION OF THE INVENTION

Figure 1:
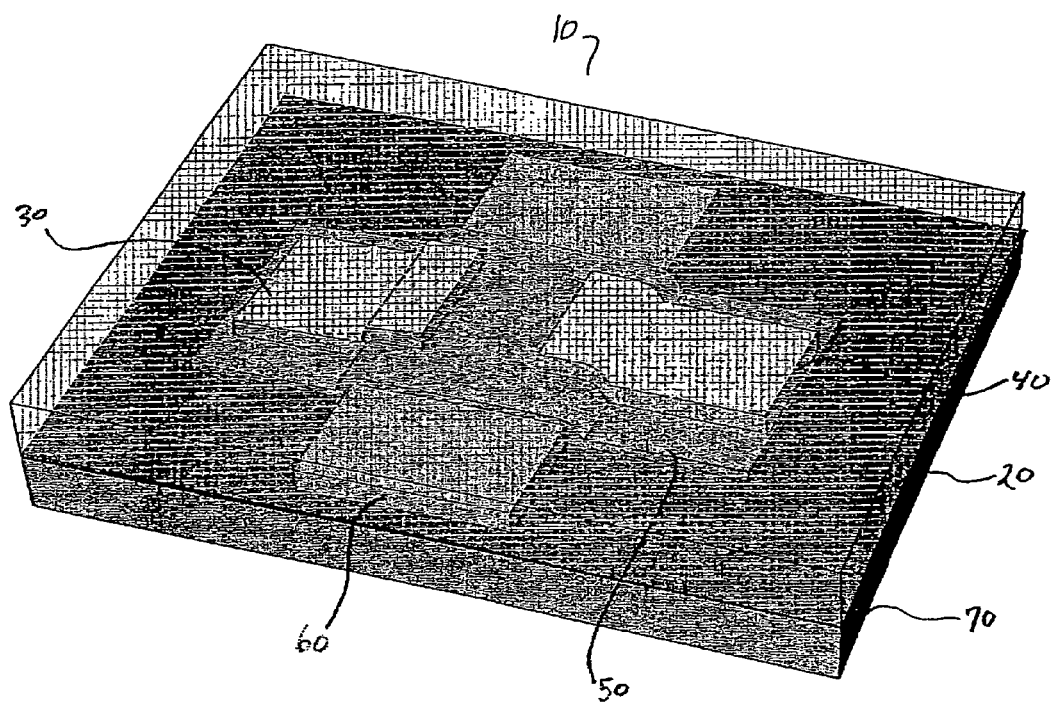
FIG. 1 is a configuration of a transistor coated with a pentathienyl-fluorene copolymer.

The first aspect of the present invention relates to a pentathienyl-fluorene copolymer having structural units represented by following formula:

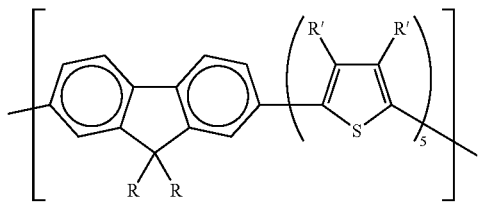

where R and R' are each independently a substituent or H. The copolymer is preferably substituted so as to be adequately soluble in an organic solvent so that the resultant solution may be applied to a substrate to form a transistor.

Preferably, each R independently contains $C_1$-$C_{20}$ linear or branched alkyl groups, $C_5$-$C_{30}$ aryl groups, or $C_6$-$C_{40}$ aralkyl groups, or both R groups together with the 9-carbon atom of the fluorenyl group forms a $C_{5-20}$ ring structure. Each R group may optionally contain one or more heteroatoms, such as O, S, N, P, or Si. More preferably, each R is independently $C_5$-$C_{12}$ linear or branched alkyl, $C_1$-$C_{20}$ alkoxyalkyl, or $C_1$-$C_{12}$ alkyloxyphenyl. Most preferably, each R is n-hexyl, n-octyl, or n-hexyloxylphenyl. Preferably, each R' is independently H, $C_1$-$C_{30}$ linear or branched alkyl, or $C_1$-$C_{30}$ alkoxyalkyl. More preferably, each R' is independently H or $C_1$-$C_{12}$ linear or branched alkyl. Examples of pentathienyl groups include an unsubstituted pentathienyl group, a 3"-substituted-α-pentathienyl group, or a 3",4"-disubstituted-α-pentathienyl group, as shown:

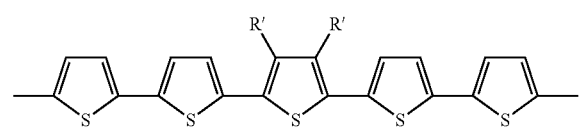

where R' is previously defined.

The copolymer of the present invention can be prepared by coupling a 5,5""-dibromopentathiophene with a 2,7-fluorene diboronate ester or a 2,7-fluorene diboronic acid. Preferably, the 2,7-fluorene diboronate ester or diboronic acid is a 9,9-disubstituted-2,7-fluorene diboronate ester or diboronic acid; preferably the 5,5""-dibromopentathiophene is a 5,5""-dibromo-3",4"-dialkyl-α-pentathiophene. A 9,9-disubstituted-2,7-fluorene diboronate ester can be prepared by any suitable method such as those well known in the art, for example, as described in U.S. Pat. No. 6,169,163, column 37, lines 65-67 and column 38, lines 1-40, which description is incorporated herein by reference. A preferred dibromopentathiophene can be prepared in accordance with the following reaction scheme:

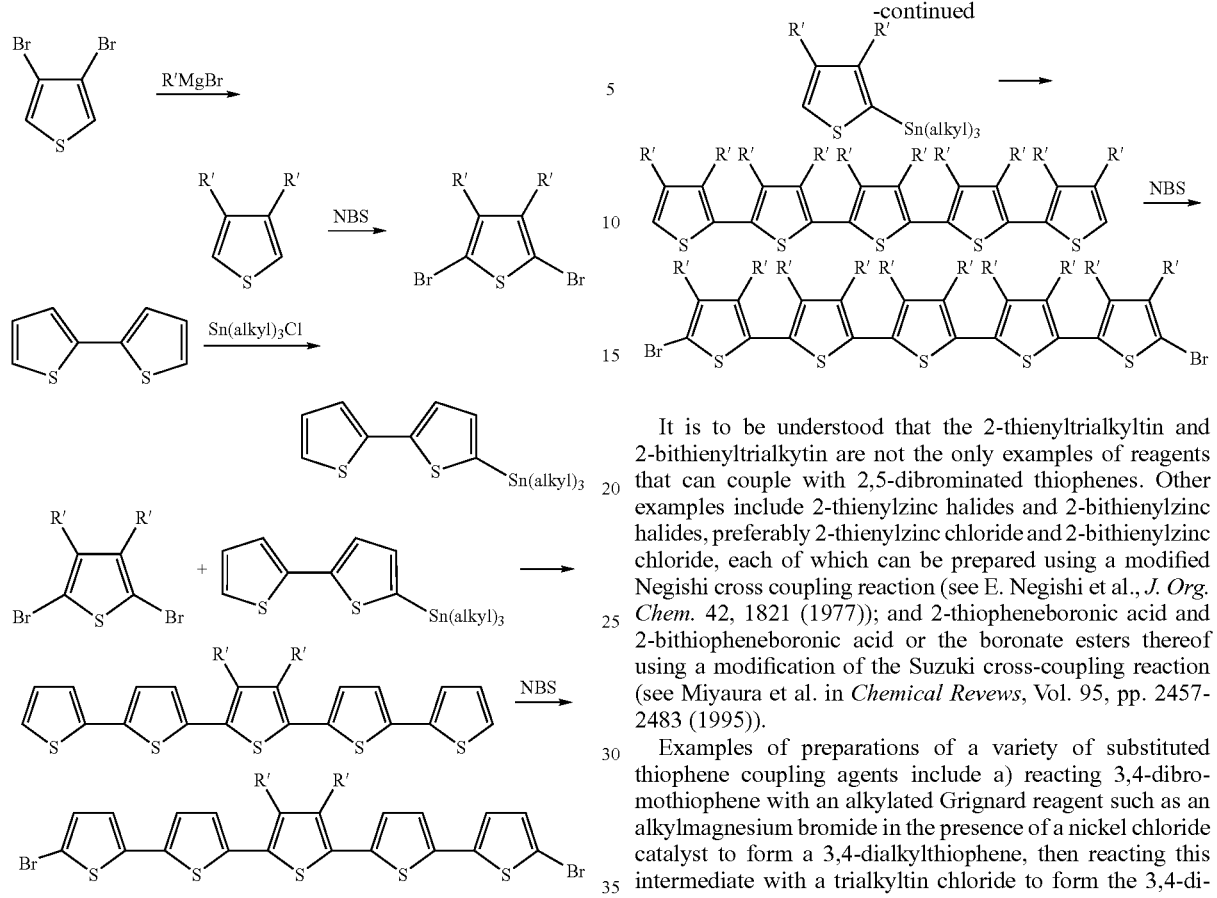

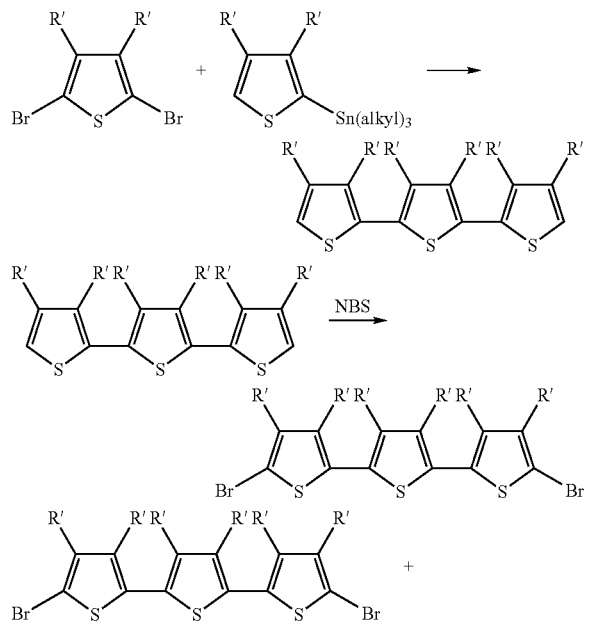

Also, a variety of polysubstituted dibrominated pentathiophenes can be prepared starting by coupling a substituted or unsubstituted terthiophene with a substituted or unsubstituted thiophene, as illustrated:

It is to be understood that the 2-thienyltrialkyltin and 2-bithienyltrialkytin are not the only examples of reagents that can couple with 2,5-dibrominated thiophenes. Other examples include 2-thienylzinc halides and 2-bithienylzinc halides, preferably 2-thienylzinc chloride and 2-bithienylzinc chloride, each of which can be prepared using a modified Negishi cross coupling reaction (see E. Negishi et al., *J. Org. Chem.* 42, 1821 (1977)); and 2-thiopheneboronic acid and 2-bithiopheneboronic acid or the boronate esters thereof using a modification of the Suzuki cross-coupling reaction (see Miyaura et al. in *Chemical Revews*, Vol. 95, pp. 2457-2483 (1995)).

Examples of preparations of a variety of substituted thiophene coupling agents include a) reacting 3,4-dibromothiophene with an alkylated Grignard reagent such as an alkylmagnesium bromide in the presence of a nickel chloride catalyst to form a 3,4-dialkylthiophene, then reacting this intermediate with a trialkyltin chloride to form the 3,4-dialkyl-2-thienyltrialkytin; b) reacting a 2-bromo-3-alkylthiophene with magnesium to generate the Grignard reagent, then reacting this intermediate with a zinc halide to form a 3-alkyl-2-thienylzinc halide; or c) reacting a 3-alkylthiophene with n-butyllithium in the presence of an amine such as N,N,N',N'-tetramethylethylenediamine (TMEDA) or triisopropylamine to form a 4-alkyl-2-thienyllithium intermediate, then reacting this intermediate with a zinc halide to form a 4-alkyl-2-thienylzinc halide.

The copolymer of the present invention may also include additional arylene structural units including substituted or unsubstituted thienylenes, bithienylenes, 1,4-phenylenes, 4,4'-biphenylenes, anthracene-9,10-diyls, naphthalene-1,4-diyls, naphthalene-2,6-diyls, 2,1,3-benzothiadiazoles-4,7-diyls, N-substituted carbazole-3,8-diyls, N-substituted carbazole-4,7-diyls, dibenzosilole-3,8-diyls, dibenzosilole-4,7-diyls, N-substituted-phenothiazine-3,7-diyls, N-substituted-phenoxazines-3,7-diyls, triarylamine-diyls including triphenylamine-4,4'-diyls, diphenyl-p-tolylamine-4,4'-diyls, and N,N-diphenylaniline-3,5-diyls, N,N,N',N'-tetraaryl-1,4-diaminobenzene-diyls, N,N,N',N'-tetraarylbenzidine-diyls, arylsilane-diyls.

In a second aspect, the present invention is a transistor comprising a semiconducting transistor channel constructed of a pentathienyl-fluorene copolymer. A schematic of a preferred bottom gate, co-planar transistor is depicted in FIG. 1. The transistor (10) comprises a copolymer layer (20) superposing a gold source contact (30), a gold drain contact (40) and a silicon nitride gate dielectric (50). The source contact (30) and the drain contact (40) typically have a height above the dielectric (50) in the range of about 20-100 nm. The dielectric (50), which has a capacitance typically in the range of 0.1-100 nanofarads (nF) and, optionally the copolymer, superpose a gold gate (60) and a substrate (70), which can be glass or a flexible material such as plastic. The channel length, which is the distance between source contact (30) and drain contact (40), typically is in the range of 1-100 microns. The channel width (70), typically falls in the range of 10 microns-10 mm. The copolymer layer (20), which is typically 10-200 nm thick, can be applied to the device as a solution (e.g, 0.5-4 weight percent in xylene), using a variety of techniques including spin coating, ink jet coating, or dip coating. The gold source contact (30), the gold drain contact (40), and the gold gate (60) can be applied, for example, by sputtering or evaporation. The silicon nitride gate dielectric (50) can be applied, for example, by chemical vapor deposition.

It has been surprisingly discovered that the copolymer of the present invention can be used to make a transistor with low threshold voltage variability.

The following examples are for illustrative purposes only and are not intended to limit the scope of the invention.

EXAMPLE 1

Synthesis of 5,5''''Dibromo-3'',4''-dihexyl-α-pentathiophene

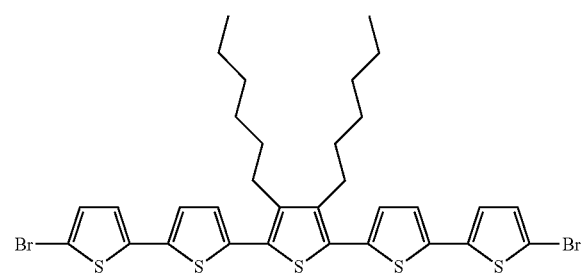

A. Preparation of 5-Trimethylstannyl-2,2'-bithiophene

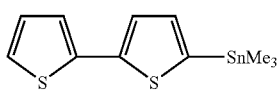

To a 3-necked flask equipped with a glass stopper, rubber septum and a nitrogen inlet was added 2,2'-bithiophene (10 g, 60.1 mmol) and anhydrous THF (100 mL). The dark (green) solution was cooled to 0° C. A 2.5 M solution of n-BuLi in hexane (26.4 mL, 66 mmol) was added via syringe. The reaction mixture was then stirred at 25° C. for 1.5 hours. The mixture was cooled to −78° C. and a 1.0 M solution of trimethylstannyl chloride in THF (66 mL, 66 mmol) was added slowly via syringe. The reaction mixture was allowed to warm to 25° C. and was stirred overnight. THF was removed in vacuo and the residue was dissolved in pentane (200 mL). The pentane layer was washed with water (3×200 mL), dried over MgSO$_4$, and the pentane was removed in vacuo to yield a green oil. The oil was purified by vacuum distillation (118-120° C., 0.6 mmHg) to yield 12.5 g (64%) of product MS=330.

B. Preparation of 2,5 Dibromo-3,4-dihexylthiophene

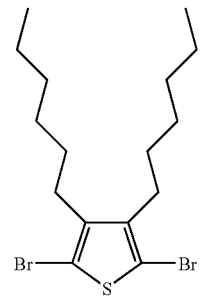

To a 250 mL, 3-necked, round bottom flask equipped with a glass stopper, rubber septum and a reflux condenser connected to a nitrogen inlet was added 3,4,-dihexylthiophene (20.14 g, 0.0797 mol) dissolved in DMF (80 mL). To this solution, was added NBS (28.37 g, 0.159 mol) and the mixture was stirred at room temperature for 1.5 hours. The reaction mixture was then poured into water and extracted with pentane (3×200 mL). The combined pentane fractions were washed with water (3×300 mL), dried over MgSO$_4$, after which time the pentane was removed in vacuo to yield a clear yellow oil. The oil was purified by vacuum distillation (135° C., 0.6 mmHg) to yield 28.0 g (77%) of a pale yellow oil. MS=410.

C. Preparation of 3'',4''-Dihexyl-α-pentathiophene

To a 250 ml, 3-necked, round bottom flask equipped with a glass stopper, rubber septum and a reflux condenser connected to a nitrogen inlet was added 5-trimethylstannyl-2,2'-bithiophene (8.28 g, 25 mmol), 2,5 dibromo-3,4-dihexylthiophene (4.92 g, 25 mmol), and DMF (100 mL). The flask was purged with nitrogen for 10 min, then a solution of Pd(PPh$_3$)$_2$Cl$_2$ (0.35 g, 25 mmol) was added and the dark mixture was heated at 90° C. for 18 h. The solution was cooled, poured into a solution 3% NaCl in water (800 mL), and the aqueous mixture was extracted with ether (3×200 ml). The combined ether layers were washed with a solution of 3% NaCl in water (3×200 mL), dried over MgSO$_4$, and the ether was removed in vacuo to yield an orange solid. Ethanol (500 mL) was added to the crude product and heated to 90° C. until the solid had dissolved. The ethanol was decanted to a clean flask and precipitate was collected by filtration. Yield: 5.70 g, 81%.

D. Synthesis of 5,5''''-Dibromo 3'',4''-dihexyl-α-pentathiophene

To a 250 ml, 3-necked, round bottom flask equipped with a glass stopper, an addition funnel and a reflux condenser connected to a nitrogen inlet was added 3'',4''-dihexyl-α-pentathiophene (7.02 g, 12.8 mmol), THF (150 mL), and acetic acid (75 mL). To the addition funnel, NBS (4.19 g, 23.56 mmol) was dissolved in THF (50 mL) and acetic acid (25 mL). This solution was added dropwise to the 3'',4''-dihexyl-α-pentathiophene solution at 0° C. over a period of 45 min. The reaction mixture was stirred for an additional 45 min, then monitored by LC. Additional NBS (0.32 g, 1.83 mmol)

was added to the reaction mixture and stirring was continued for an additional 15 min. Distilled water (500 mL) was added to the reaction mixture and the precipitated solid was collected by filtration. The solid was washed with 10% NaHCO$_3$ and water, then dried over magnesium sulfate. The solid was redissolved in CH$_2$Cl$_2$ (200 ml), then passed over silica gel, followed by washing with CH$_2$Cl$_2$ (200 mL). The solvent then was evaporated in vacuo to yield an orange-colored solid. The orange solid was crystallized from acetone. Yield: 8.1 g, 90%.

EXAMPLE 2

Preparation of a Pentathienyl-fluorene Copolymer

To a 250 mL three-necked round bottom flask fitted with a reflux condenser (with nitrogen inlet and overhead stirrer was added 9,9-dioctylfluorene-2,7-diboronate ester (3.77 g, 7.10 mmol), 5,5''''-dibromo 3'',4''-dihexyl-α-pentathiophene (5.65 g, 7.66 mmol), Aliquot 336 phase transfer catalyst (0.87 g, 02.16 mmol), [Pd(PPh$_3$)$_2$Cl$_2$] (0.0073 g, 0.010 mmol), and toluene (92 mL). After stirring for a few minutes to dissolve most of the solids, a sodium carbonate solution (2 M, 13.1 mL, 26.2 mmol) was added. The reaction mixture was then heated at 95° C. for 5 hours. Phenylboronic acid (0.46 g, 3.77 mmol) in THF (10 ml) and [Pd(PPh$_3$)$_2$Cl$_2$] (0.0073 g, 0.010 mmol) were then added, and stirring was continued for 16 hrs at 95° C. The reaction mixture was diluted with toluene (230 mL), the organic layer was separated and washed with warm water (3×230 mL). The solution was then treated with an aqueous solution of diethyldithiocarbamic acid sodium salt trihydrate (7.5%, DDC, 76.6 mL) and heated at 80° C. overnight. The aqueous layer was separated and discarded and the organic layer was washed with warm water (3×230 mL) and the polymer precipitated into methanol (2.3 L). The polymer was collected via filtration, washed with methanol (200 mL), then redissolved in hot toluene (960 mL), from which 60 mL was boiled off. The hot polymer solution was passed through a tightly packed column of celite (1×8 cm), silica gel (4×8 cm), and basic alumina (3×8 cm) (previously rinsed with 200 mL of hot toluene). The polymer solution was collected, then the volume of the solution was concentrated to approximately 500 mL. The polymer was precipitated into methanol (2.3 L), washed with methanol (230 mL), acetone (230 mL), and again with methanol (230 mL). The polymer was then dried in vacuo at 60° C. overnight to yield red orange material. Yield: 5.59 g.

EXAMPLE 3

Preparation and Testing of Transistors Containing a Pentathienyl-fluorene Copolymer The surfaces of pre-prepared multilevel structures, substantially as depicted in elements (30)-(70) of FIG. 1, were cleaned using an O$_2$ plasma asher to remove organic residue. The surfaces were then rinsed with DI water, then dried. Each structure had channel widths of 1 mm, each contained a glass substrate, a gold gate, a gate dielectric (capacitance of ~22 nF), a gold source (height ~70 nm), and a gold drain (height ~70 nm). The channel lengths of the structures varied from 5 μm to 50 μm. Transistor devices substantially as depicted in FIG. 1 were prepared by spin coating a 1% xylene solution of the pentathienyl-fluorene copolymer prepared as described in Example 2. Table 1 shows the estimated threshold voltage for the first voltage sweep (V$_T$$^0$), the charge carrier mobility (μ$_{fe}$), and the difference in the threshold voltage between consecutive sweeps (ΔV$_T$, also known as hysteresis). ΔV$_{T1}$ refers to hysteresis after one day and ΔV$_{T7}$ refers to hysteresis after seven days.

TABLE 1

| Measurement of Transistor Properties | | | | |
|---|---|---|---|---|
| | Gate Length 50 μm | Gate Length 20 μm | Gate Length 10 μm | Gate Length 5 μm |
| μ$_{fe}$ (cm$^2$/V-sec) | 4.62 × 10$^{-4}$ | 8.73 × 10$^{-4}$ | 1.01 × 10$^{-3}$ | 2.27 × 10$^{-3}$ |
| V$_T$$^0$ | 2 V | 2 V | 3 V | 8 V |
| ΔV$_{T1}$ | 0 V | 0 V | 0 V | 0 V |
| ΔV$_{T7}$ | 0 V | 0 V | 0 V | 0 V |

What is claimed is:

1. A pentathienyl-fluorene copolymer having structural units represented by following formula:

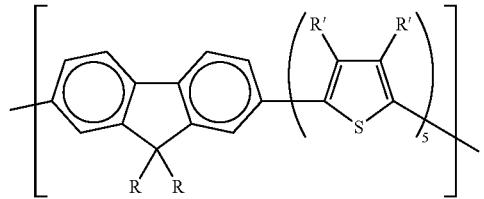

where R and R' are each independently a substituent or H.

2. The pentathienyl-fluorene copolymer of claim 1 wherein each R is independently H, C$_1$-C$_{20}$ linear or branched alkyl, C$_5$-C$_{30}$ aryl, or C$_6$-C$_{40}$ aralkyl, and optionally one or more heteroatoms selected from the group consisting of O, S, N, P, and Si; and each R' is independently H, C$_1$-C$_{30}$ linear or branched alkyl, or C$_1$-C$_{30}$ alkoxyalkyl.

3. The pentathienyl-fluorene copolymer of claim 2 wherein each R is n-hexyl, n-octyl, or n-hexyloxylphenyl and each R' is independently H or or C$_1$-C$_{12}$ linear or branched alkyl.

4. The pentathienyl-fluorene copolymer of claim 1 which contains pentathienyl structural units represented by the following formula:

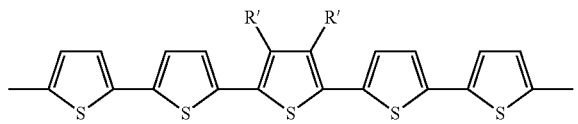

where each R' is independently H or C$_1$-C$_{12}$ linear or branched alkyl.

5. The pentathienyl-fluorene copolymer of claim 4 wherein at least one R' is C$_1$-C$_{12}$ linear or branched alkyl.

6. The pentathienyl-fluorene copolymer of claim 4 wherein R' is n-hexyl or n-octyl.

7. A transistor comprising a semiconducting transistor channel constructed of a pentathienyl-fluorene copolymer having structural units represented by following formula:

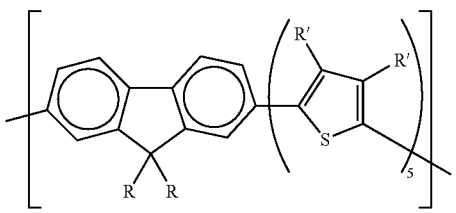

where R and R' are each independently a substituent or H.

8. The transistor of claim 7 wherein R is n-hexyl, n-octyl, or n-hexyloxylphenyl and each R' is independently H or or $C_1$-$C_{12}$ linear or branched alkyl.

9. The transistor of claim 8 wherein the pentathienyl-fluorene copolymer o pentathienyl structural units represented by the following formula:

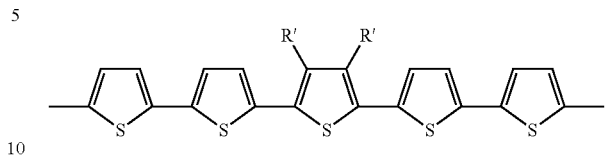

where each R' is independently H or $C_1$-$C_{12}$ linear or branched alkyl.

10. The transistor of claim 9 wherein R' is n-hexyl or n-octyl.

* * * * *